United States Patent
Choi et al.

(10) Patent No.: US 7,340,002 B2
(45) Date of Patent: Mar. 4, 2008

(54) PRAGMATIC TRELLIS CODE MODULATION DECODER AND A METHOD THEREOF

(75) Inventors: Eun A Choi, Daejon (KR); Nae-soo Kim, Daejon (KR); Deock Gil Oh, Daejon (KR); Ji Won Jung, Busan (KR)

(73) Assignee: Electronics and Telecommunications Research Institute (KR)

( * ) Notice: Subject to any disclaimer, the term of this patent is extended or adjusted under 35 U.S.C. 154(b) by 673 days.

(21) Appl. No.: 10/719,509

(22) Filed: Nov. 21, 2003

(65) Prior Publication Data

US 2004/0117720 A1 Jun. 17, 2004

(30) Foreign Application Priority Data

Nov. 22, 2002 (KR) .................. 10-2002-0073222

(51) Int. Cl.
*H04L 5/12* (2006.01)
*H04L 23/02* (2006.01)

(52) U.S. Cl. ................ 375/262; 375/265; 375/341; 704/242; 714/792; 714/795

(58) Field of Classification Search ........... 375/341, 375/362, 279, 280, 265, 262; 714/792, 795; 704/242

See application file for complete search history.

(56) References Cited

U.S. PATENT DOCUMENTS 5,841,478 A * 11/1998 Hu et al. ............ 375/240.25
5,852,630 A * 12/1998 Langberg et al. .......... 375/219
5,995,551 A * 11/1999 McCallister et al. ........ 375/265
6,138,265 A    10/2000 Morelos-Zaragoza et al.
6,304,614 B1   10/2001 Abbaszadeh et al.
6,370,201 B1 *  4/2002 Abbaszadeh et al. ....... 375/262
6,917,655 B2 *  7/2005 Fimoff et al. .............. 375/265
2001/0031017 A1* 10/2001 Betts ......................... 375/265
2005/0229088 A1* 10/2005 Tzannes et al. ............. 714/800

OTHER PUBLICATIONS

"Pragmatic Trellis Coded Modulation: A Simulation Using 24-Sector Quantized 8-PSK", M. Ross, et al., 1992 IEEE, pp. 0232-0239.
"Performance evaluation of paragmatic TCM codes through band-limited nonlinear satellite channel: a computer simulation approach", V Dubey, et al., IEE Proceedings, vol. 139, No. 1, Feb. 1992, pp. 15-32.

* cited by examiner

*Primary Examiner*—Curtis B. Odom
(74) *Attorney, Agent, or Firm*—Blakely, Sokoloff, Taylor & Zafman (57) ABSTRACT

A pragmatic trellis code modulation decoder including a demodulator for receiving a modulated signal and computing coordination values of symbols of the modulated signal on an I-axis and Q-axis in a constellation; a coset mapper for generating 3-bit soft decision data based on the computed coordinate values; a viterbi decoder for receiving 3-bit soft decision data and generating 1-bit data as a coded data by decoding the 3-bit soft decision data; a re-encoder for receiving the 1-bit data from the viterbi decoder and obtaining un-coded information in order to compute an un-coded data; a sector phase quantizer for obtaining I channel and Q channel information based on the coordination values from the demodulator in order to obtain un-coded data; a time delayer for delaying output of the sector phase quantizer until the re-encoder outputs the un-coded information; and a non-coded code decoder for computing the un-coded data.

8 Claims, 8 Drawing Sheets

PRAGMATIC TRELLIS CODE MODULATION DECODER AND A METHOD THEREOF

FIELD OF THE INVENTION

The present invention relates to a pragmatic trellis code modulation decoder and a method thereof; and, more particularly, to a pragmatic trellis code modulation decoder for performing a soft decision without using a sector phase quantizer by using a coset mapping, a method thereof and a computer readable recoding medium storing a program for executing the same method.

DESCRIPTION OF RELATED ARTS

There are various modulation methods introduced such as a binary phase shift keying (BPSK), a quadrature phase shifting keying (QPSK) and 8 phase shifting keying (8 PSK). According to type of modulation methods, type of decoders is determined. A viterbi decoder is used for decoding a convolution code in the BPSK or QPSK modulation methods and an Ungerboeck trellis code modulation decoder is used for decoding trellis code in 8 PSK. Therefore, a conventional adaptive MODEM supporting BPSK/QPSK/8 PSK with the trellis code and convolution code is designed by implementing both two decoders, the viterbi decoder and the ungerboeck trellis code modulation decoder. Specially, the Ungerboeck TCM decoding circuit is more complex comparing to the viterbi decoder and it also requires more circuit area. Therefore, an adaptive MODEM supporting BPSK/QPSK/8 PSK by using the ungerboeck TCM decoding circuit becomes more complexes and occupies more circuit area. For overcome the problems of the conventional adaptive MODEM, a pragmatic TCM decoding method has been introduced. By implementing the pragmatic TCM decoding method, the conventional convolution decoder and virterbi decoder used for BPSK/QPSK can be used for an adaptive modem supporting BPSK/QPSK/8 PSK. As a result, a circuit area of the adaptive modem is reduced.

Figure 1:
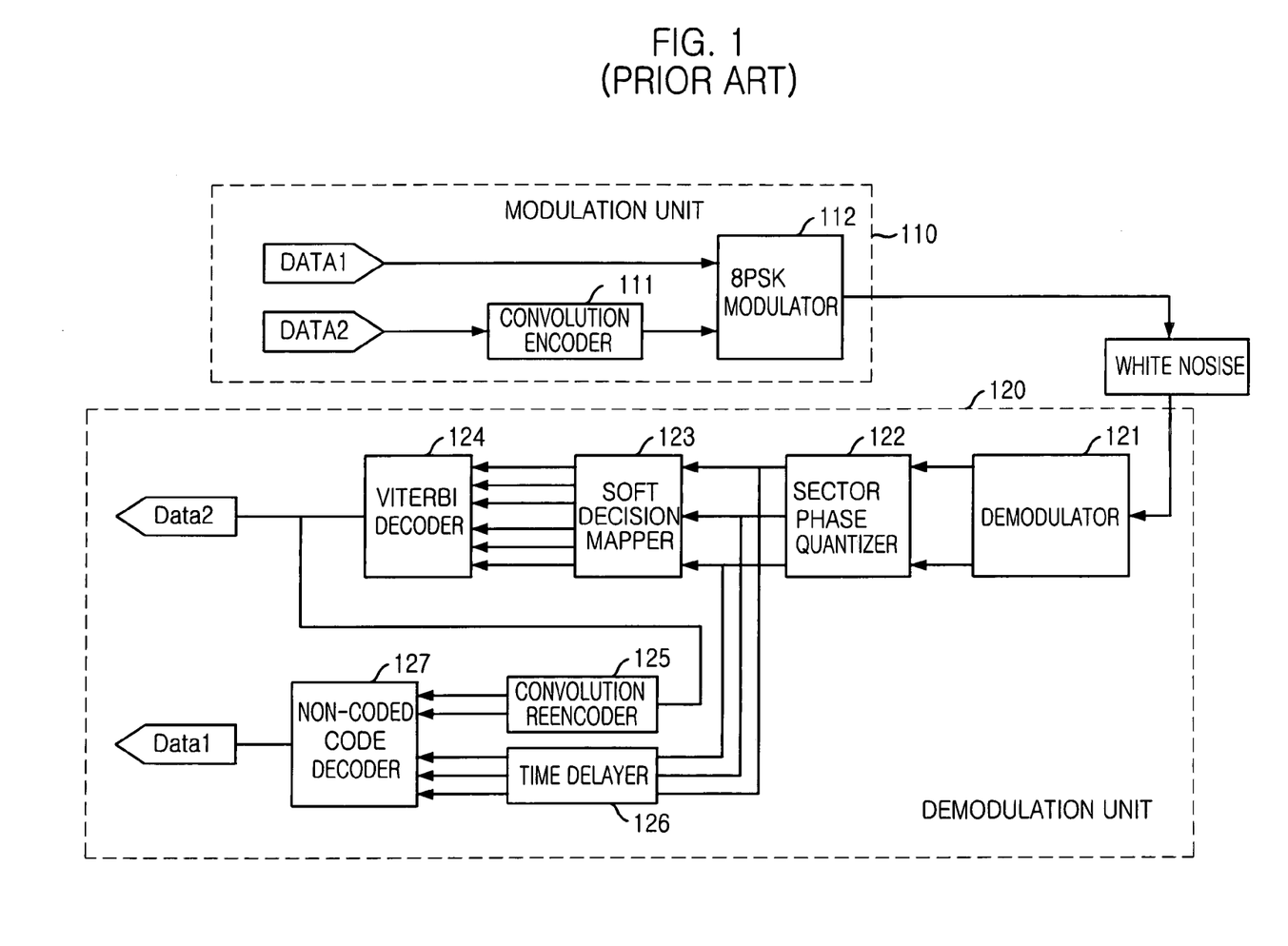
FIG. 1 is a diagram showing a conventional adaptive MODEM implementing a TC-8 PSK modulation mode and TC-8 PSK pragmatic TCM modulation mode.

FIG. 1 is a diagram showing a conventional adaptive MODEM implementing a TC-8 PSK modulation mode and TC-8 PSK pragmatic TCM modulation mode.

Referring to FIG. 1, the conventional adaptive MODEM includes a modulation unit 110 and a demodulation unit 120.

At first, the modulation unit 110 using a TC-8 PSK modulation mode is explained in detail.

The modulation unit 110 has a convolution coder 111 and a 8 PSK modulator 112. A convolution code is used in an encoding method for BPSK or QPSK. For implementing a convolution code into the TC-8 PSK modulation mode, a convolution coder 111 having ½ coding rate is used. The convolution coder 111 encodes one bit among data inputted in the modulator unit 110 and generates 2 bit coded data. Another one bit is not coded and outputted as a most significant bit (MSB) of the TCM encoder. The 8 PSK modulator 112 modulates and maps the three bits to a constellation and. Inhere, the outputs of the 8 PSK modulator is mapped to the constellation as 8 different state according to input of the modulator unit 110.

Hereinafter, a demodulation unit 120 using a TC-8 PSK pragmatic TCM demodulation method is explained in detail.

The demodulation unit 120 includes a demodulator 121, a sector phase quantizer 122, a soft decision mapper 123, a viterbi decoder 124, a convolution reencoder 125, a time delayer 126, and a non-coded code decoder 127.

A modulated signal from the modulation unit 110 is inputted to the demodulator 121 after passing through a Gaussian white noise channel. The demodulator 121 receives the modulated signal with the Gaussian white noise. The signal having the white noise is decoded after passing through the demodulator 121. A decode method is explained in below.

At first, the demodulator 121 demodulates the modulated signal from the modulator unit 110. That is, the demodulator 121 converts the received 8 PSK signal to QPSK signal's arrangement of In-phase I and Quadrature-phase channel Q for decoding TCM code by using a virterbi decoder for quantizer. Since two bits among the three bits are encoded signal at 8 PSK constellation, the sector phase quantizer SPQ 122 quantizes the encoded two bits as I and Q channels.

A signal quantization and bit allocation method according to receiving signal's location of constellation determines a value of soft decision after determining the number of soft decision bits of sector phase quantizer SPQ. The value of soft decision is determined by following equation 1. The number of sectors is 8 times of the number of soft decision levels.

$$\text{the number of sector} < 8x(2^n - 1) \qquad \text{Eq. 1}$$

In the Eq. 1, n is the number of soft decision bits and x is a number of levels for soft decision which is one of $1 \sim (2^n - 1)$.

According to Eq. 1, a constellation location region of received 8 PSK signal is detected by using the SPQ 122. The detected constellation location region of the received 8 PSK signal is converted to an arrangement of I signal and Q signal required at an input terminal of the viterbi decoder 124 and three bits soft decision signal is decoded to one bit by using the virterbi decoder 124.

The SPQ 122 compares I and Q values, and 8 regions are determined. According to the determined regions, I and Q value is soft decided. After determining a soft level standard value, absolute values of I and Q are existed between 0 and 1. A distance between levels is 0.1429 in case of quantization to 56 sectors (3 bits soft decision). One bit is decoded, if the viterbi decoder 124 decode according to soft decision value (000~111) of I and Q.

Also, for decoding MSB 1 bit, which is remained and not encoded, information of the MSB 1 bit is obtained by using convolution encoder 125. That is, the convolution encoder 125 encodes 1 bit data which is decoded by the viterbi decoder 124 in order to obtain the information of the MSB 1 bit. The non-coded code decoder 127 decodes non-coded code by using a coordinate value of received signal's I and Q. Phase information outputted from SPQ is used for decoding the non-coded code at the non-coded code decoder 127 and the phase information is inputted to the non-coded code decoder after delaying the phase information for output of encoded code outputted form the viterbi decoder.

As mentioned above, a soft decision bit must be outputted for decoding coded code in the convention pragmatic TCM decode method. Therefore, a sector phase quantizer is required for obtaining the phase information containing location of receiving signal for outputting signals inputted to the soft decision unit.

Also, the conventional pragmatic TCM decoding method performs soft decision between 0 to 0.707 which are values of amplitudes of I channel and Q channel according to sectors of receiving signals. Therefore, Euclidian distance is short and it needs to be increased.

In a meantime, a constellation of 8 PSK signal can be divided to two structures. One structure is started from 0 degree and another is started from 22.5 degree. It is not influence to a performance of modulation and demodulation unit but it is influence to a performance of error controller. The conventional pragmatic TCM decoding method can use both TC-8 PSK constellation mapping methods based on 22.5 degree and 0 degree. The conventional pragmatic TCM decoding method using TC-8 PSK constellation mapping method based on 0 degree has 0.8 dB better performance. However, there is a performance difference according to basis. Furthermore, its performance is degraded than an ungerboeck decoding method as general TCM decoding method.

SUMMARY OF THE INVENTION

It is, therefore, an object of the present invention to provide a pragmatic TCM modulator for performing soft decision without using a sector phase quantizer by using coset mapping, a method thereof and a computer readable recoding medium for storing a program executing the same method.

In accordance with an aspect of the present invention, there is provided a pragmatic trellis code modulation TCM decoder, including: a demodulator for receiving a modulated signal and computing coordination values of symbols of the modulated signal on an I-axis and Q-axis in a constellation; a coset mapper for generating 3-bit soft decision data based on the computed coordinate values; a viterbi decoder for receiving 3-bit soft decision data and generating 1-bit data as a coded data by decoding the 3-bit soft decision data; a re-encoder for receiving the 1-bit data from the viterbi decoder and obtaining un-coded information in order to compute an un-coded data; a sector phase quantizer for obtaining I channel and Q channel information based on the coordination values from the demodulator in order to obtain un-coded data; a time delayer for delaying output of the sector phase quantizer until the re-encoder outputs the un-coded information; and a non-coded code decoder for computing the un-coded data by decoding the output of the sector phase quantizer based on the un-coded information from the re-encoder and the I channel and Q channel information from the sector phase quantizer.

In accordance with another aspect of the present invention, there is also provided a decoding method for a pragmatic trellis code modulation TCM decoder, including the steps of: a) receiving a modulated signal and computing coordination values of symbols of the modulated signal on an I-axis and Q-axis in a constellation; b) generating 3-bit soft decision data based on the computed coordinate values; c) receiving the 3-bit soft decision data and generating 1-bit data as a coded data by decoding the 3-bit soft decision data; d) receiving the 1-bit data and obtaining un-coded information in order to compute an un-coded data; e) obtaining I channel and Q channel information based on the coordination values from the demodulator in order to obtain un-coded data; f) delaying an output of the sector phase quantizer until step d) outputs the un-coded information; and G) computing the un-coded data by decoding the output of the sector phase quantizer based on the un-coded information from the re-encoder and the I channel and Q channel information from the sector phase quantizer.

In accordance with still another aspect of the present invention, there is also provided a computer readable recoding medium for storing a program for executing a method of pragmatic TCM decoder, the method including the steps of: a) receiving a modulated signal and computing coordination values of symbols of the modulated signal on an I-axis and Q-axis in a constellation; b) generating 3-bit soft decision data based on the computed coordinate values; c) receiving the 3-bit soft decision data and generating 1-bit data as a coded data by decoding the 3-bit soft decision data; d) receiving the 1-bit data and obtaining un-coded information in order to compute an un-coded data; e) obtaining I channel and Q channel information based on the coordination values from the demodulator in order to obtain un-coded data; f) delaying an output of the sector phase quantizer until step d) outputs the un-coded information; and G) computing the un-coded data by decoding the output of the sector phase quantizer based on the un-coded information from the re-encoder and the I channel and Q channel information from the sector phase quantizer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 2:
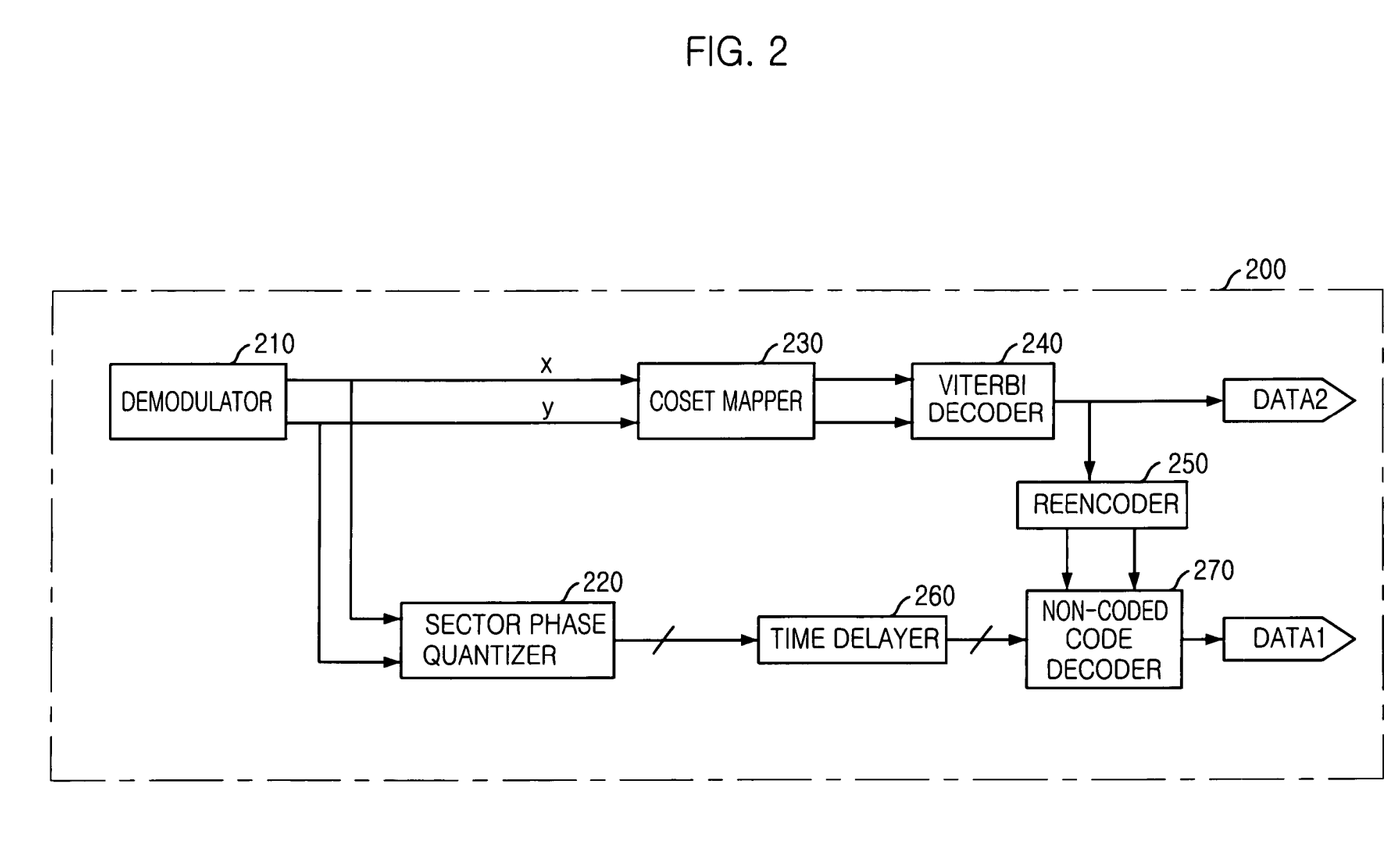
FIG. 2 is a diagram illustrating a pragmatic trellis code modulator with 8-PSK modulation mode in accordance with a preferred embodiment of the present invention.

FIG. 2 is a diagram illustrating a pragmatic trellis code demodulator 200 with 8-PSK modulation mode in accordance with a preferred embodiment of the present invention.

The pragmatic trellis code demodulator 200 includes a demodulator 210, a coset mapper 230, a viterbi decoder 240, a reencoder 250, a sector phase equalizer 220, a time delayer 260 and a non-coded code decoder 270.

The demodulator 210 obtains coordination values of x and y, when coordination values of I channel and Q channel on a constellation of received M-PSK symbol are x and y. After computing the coordination values of x and y, the coordination values are inputted to a coset mapper 230. The coset mapper 230 is a main part of the present invention that computes a 3-bit soft decision data which is inputted to a viterbi decoder based on the coordination values from the demodulator 210. Operations of the coset mapper 230 are explained in hereinafter.

An amplitude r and phase θ can be computed from below equation 2 by using the coordination value computed from the conventional modulator.

$$r = \sqrt{x^2 + y^2}, \theta = \tan^{-1}\left(\frac{y}{x}\right) \qquad \text{Eq. 2}$$

Figure 3:
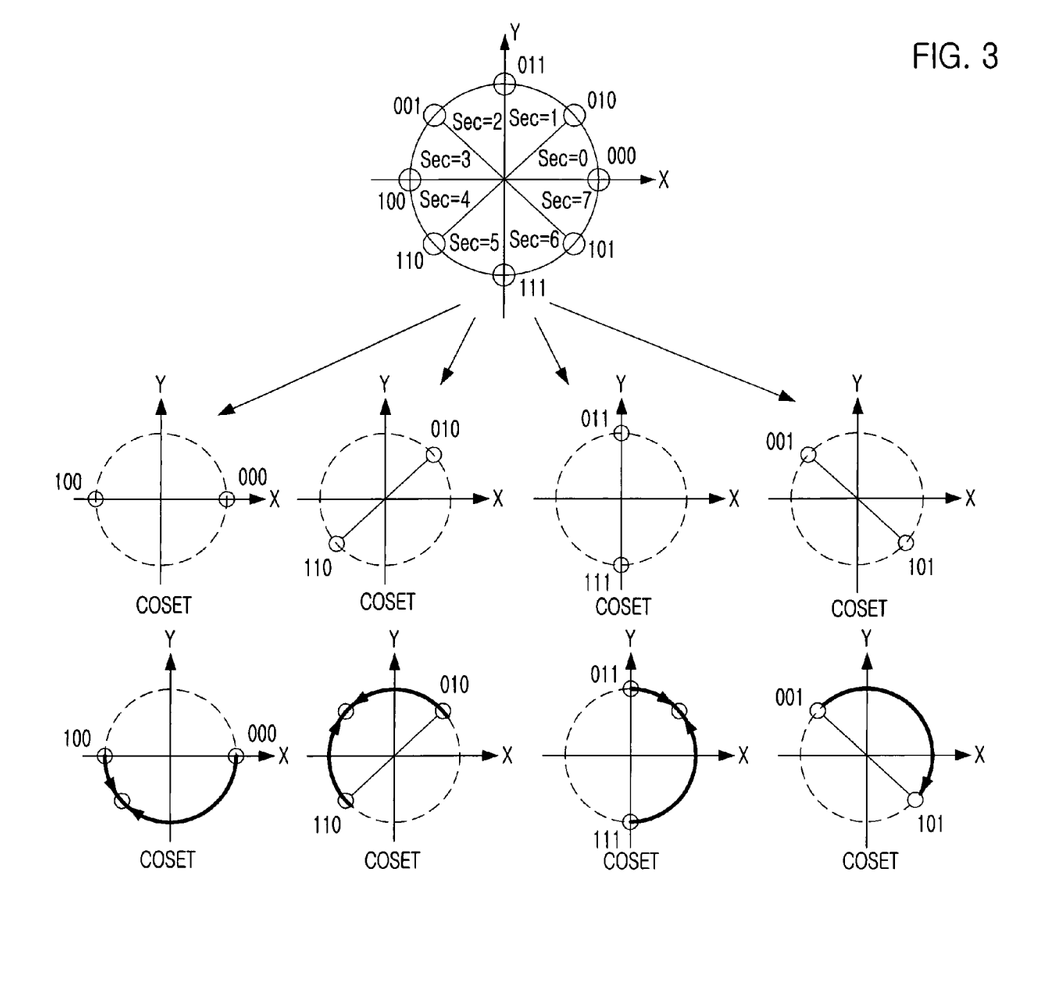
FIG. 3 shows a constellation at x' and y' in accordance with a preferred embodiment of the present invention.

For computing an input symbol (x', y') in order to performing 3 bits soft decision, a phase value and the coordinate values (x, y) of I and Q axis on the constellation are used. A relation between the input symbol (x', y') and the coordinate value (x, y) of I and Q channel on the constellation is a rotational transformation and it is defined as following equation3.

$$x' = \cos[2(\phi - \Phi)], y' = \sin[2(\phi - \Phi)] \qquad \text{Eq. 3}$$

In the present invention, if it is set to $$\Phi = \frac{5\pi}{8},$$

a constellation of QPSK is arranged at 45, 135, 225 and 315 degrees. Therefore, the conventional soft decision method performing soft decision between −1 to 1 can be used. Therefore, the present invention can output soft decision bit by using mapping on constellation without outputting 3 soft decision bits inputted to the viterbi decoder using a sector phase quantizer and soft decision unit in conventional pragmatic TCM demodulation method.

As mentioned above, the coset mapper 230 computes the 3-bit soft decision data and outputs to the viterbi decoder 240. The viterbi decoder 240 decodes the 3-bit soft decision data to 1-bit data.

The convolution reencoder 250 receives the 1-bit data from the viterbi decoder 240 and decodes the 1-bit data in order to obtain information for obtaining MSB 1 bit. After obtain information, the convolution reencoder 250 transmits it to the non-coded code decoder 270.

In a meantime, the coordination value of I and Q axis on the constellation can be used for obtaining information of computing a value of un-coded one bit and it can be computed by identical method used in the conventional pragmatic TCM demodulation method. That is, remained operations of the sector phase quantizer 220, the time delayer 260 and the non-coded code decoder 270 are omitted here since they are same as operations of the sector phase quantizer 122, the time delayer 126 and the non-coded code decoder 127 in FIG. 1.

Figure 4:
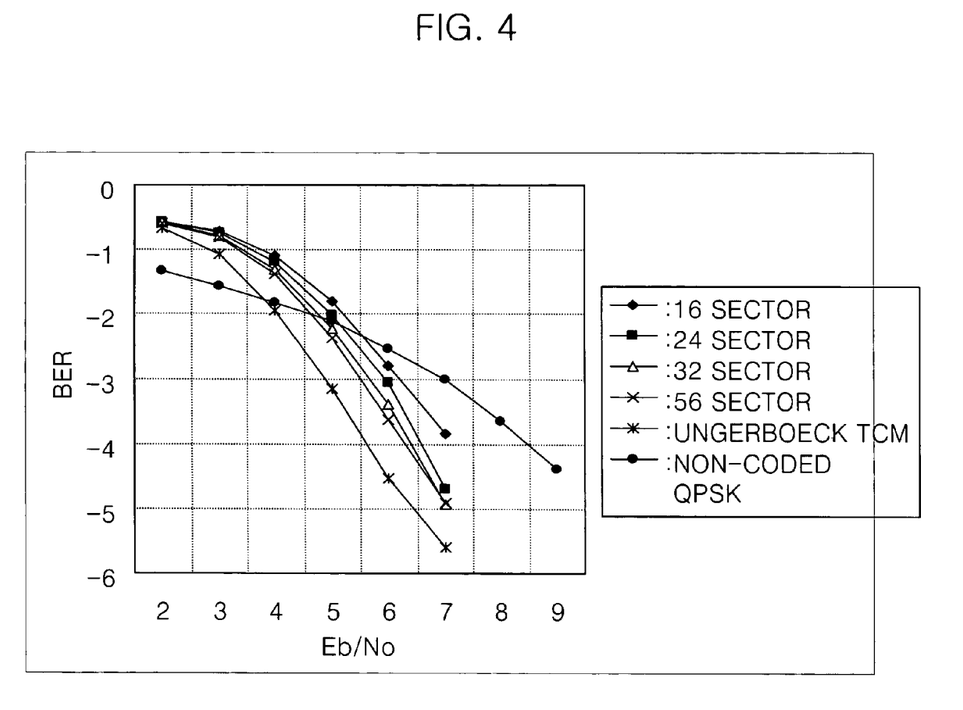
FIG. 4 is a graph for showing a bit error rate presenting a performance of pragmatic TCM according to the number of sectors in a conventional pragmatic TCM demodulation method.
Figure 5:
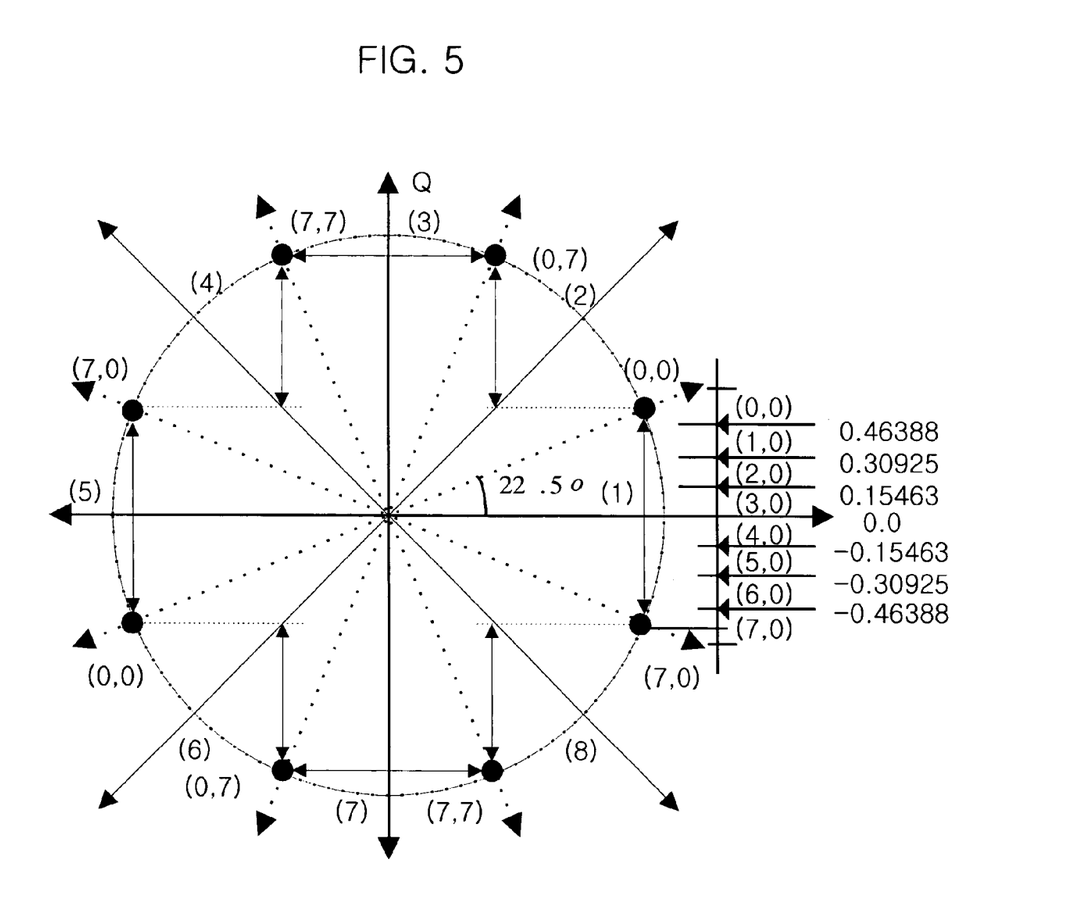
FIG. 5 shows a constellation of a conventional soft decision assignment at 22.5 degree.

FIG. 4 is a graph for showing a bit error rate presenting a performance of pragmatic TCM according to the number of sectors in a conventional pragmatic TCM demodulation method. For analyzing the performance, the Gaussian noise channel environment is used.

Comparing to uncoded QPSK in $10^6$ of data rate, there is performance improved about 1.5 dB in 16 sector phase and 2~2.2 dB in 24, 32 and 56 sector phases. However, comparing to the conventional Ungerboeck TCM which is not quantized, there is about 0.5 dB degradation. A length of mean soft decision of soft decision assignment based on 22.5 degree causes performance degradation since the length is shorter than that of soft decision assignment based on 0 degree.

Figure 6:
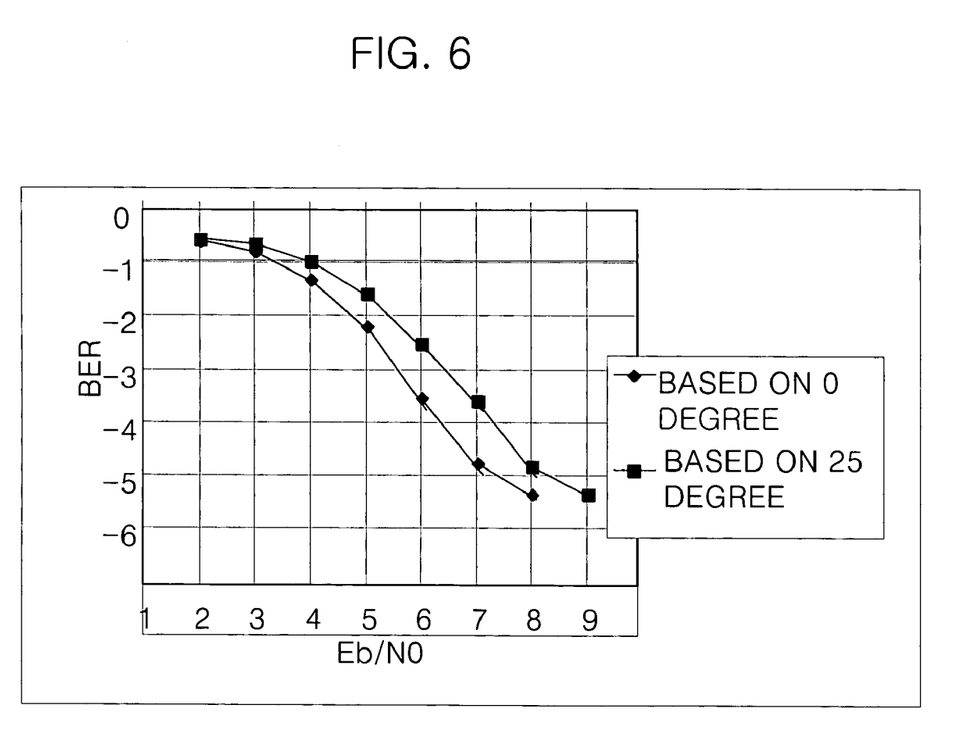
FIG. 6 is a graph showing a bit-error rate representing a performance of a pragmatic TCM at 0 degree and 22.5 degree.

FIG. 6 is a graph showing a bit-error rate representing a performance of a pragmatic TCM at 0 degree and 22.5 degree.

Figure 7:
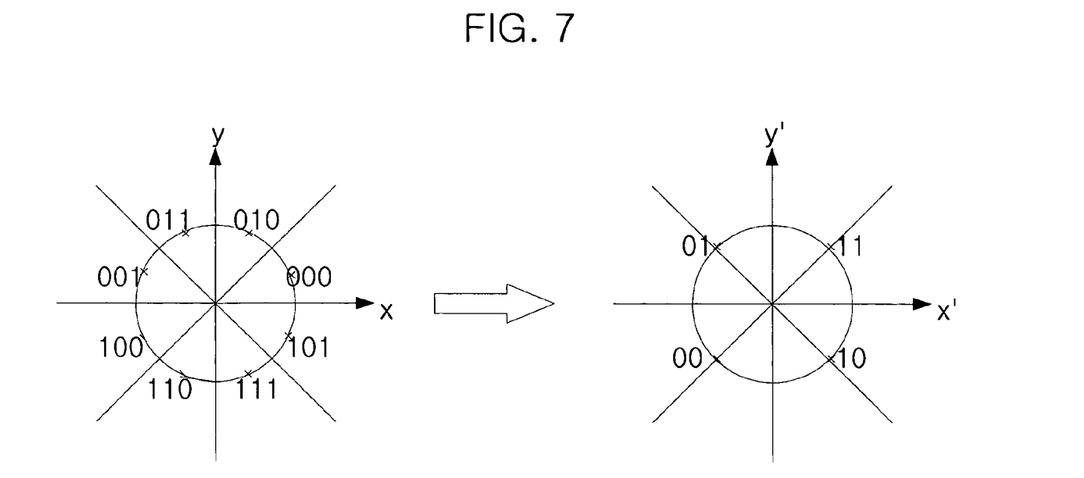
FIG. 7 shows a constellation for explaining a method of pragmatic TCM-8 PSK modulation mode in accordance with a preferred embodiment of the present invention.

Referring to FIG. 6, since Euclidian distance affects the performance, there is 0.8 dB performance degradation in the modulated signal at 22.5 degree of 8 BPSK comparing to a modulated signal at 0 degree. However, the above mentioned degradation can be overcame by using the pragmatic TCM algorithm of the present invention, if $$\Phi = \frac{\pi}{2}$$

is set. (Referring to FIG. 7)

Figure 8:
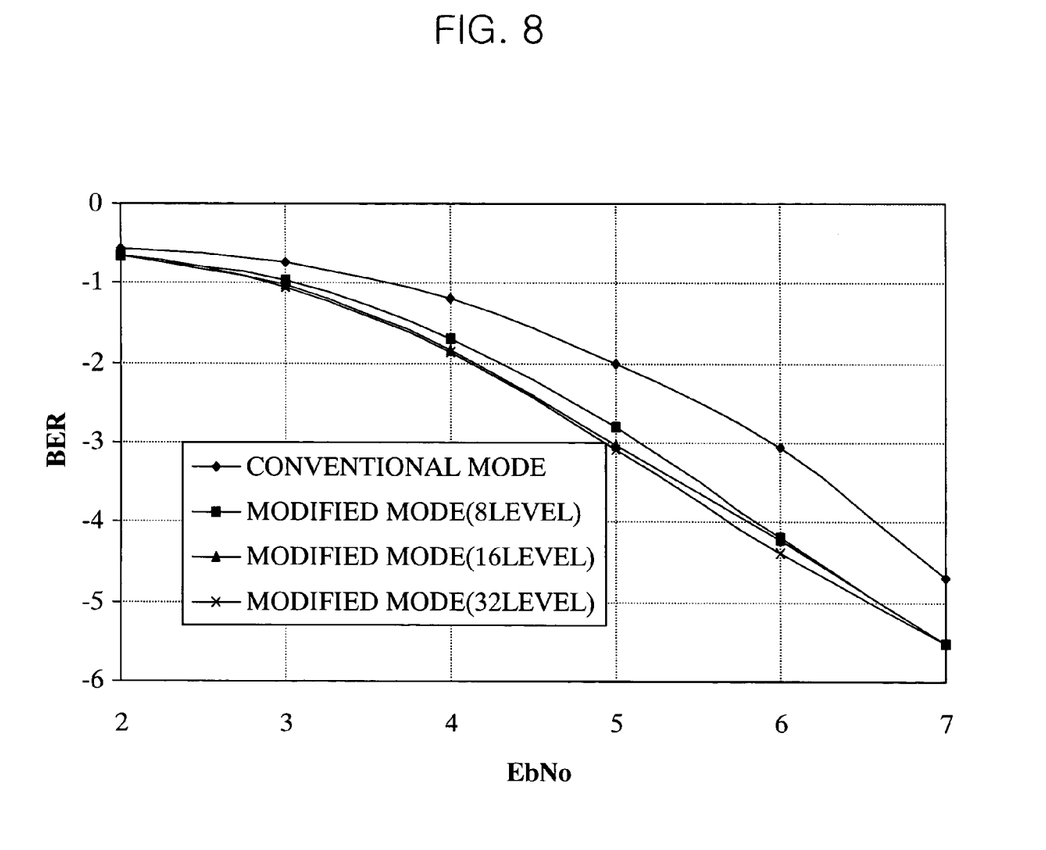
FIG. 8 is a bit-error ratio graph showing a performance of a pragmatic TCM decoder in accordance with a preferred embodiment of the present invention.

In a meantime, as shown in FIG. 8, a performance of the present invention, which is modified pragmatic TCM structure, is enhanced about 0.8 dB. Also, there is 1.6 dB performance increased at a constellation started at 22.5 degree.

The above mentioned present invention can output a 3-bit soft decision without using a sector phase quantizer by using new constellation mapping method, accordingly, the present invention can obtain a coding gain of 1.6 dB.

Also, the present invention can prevent performance difference according to a basis degree of a constellation such as 0 degree and 25 degree.

Furthermore, the present invention can increase its distance to −1 or 1 comparing to the conventional pragmatic TCM decoder.

Moreover, the above mentioned method can be implemented as a program and it can be stored in a computer readable recoding medium such as a CD-ROM, a RAM, a ROM, floppy disk, a hard disk and a magnetic optical disk.

While the present invention has been described with respect to certain preferred embodiments, it will be apparent to those skilled in the art that various changes and modifications may be made without departing from the scope of the invention as defined in the following claims.

What is claimed is:

1. A pragmatic trellis code modulation TCM decoder, comprising:
   a demodulator for receiving a modulated signal and computing coordination values of symbols of the modulated signal on an I-axis and Q-axis in a constellation;
   a coset mapper for generating 3-bit soft decision data based on the computed coordinate values;
   a viterbi decoder for receiving 3-bit soft decision data and generating 1-bit data as a coded data by decoding the 3-bit soft decision data;
   a re-encoder for receiving the 1-bit data from the viterbi decoder and obtaining un-coded information in order to compute an un-coded data;
   a sector phase quantizer for obtaining I channel and Q channel information based on the coordination values from the demodulator in order to obtain un-coded data;
   a time delayer for delaying output of the sector phase quantizer until the re-encoder outputs the un-coded information; and
   a non-coded code decoder for computing the un-coded data by decoding the output of the sector phase quantizer based on the un-coded information from the re-encoder and the I channel and Q channel information from the sector phase quantizer.

2. The pragmatic trellis code modulation TCM decoder as recited to claim 1, wherein the coset mapper provides the 3-bit soft decision by using an equation as x'= cos [2(ϕ−Φ)], y'=sin [2(ϕ−Φ)] based on a phase difference between a basis phase, Φ, and ϕ, wherein ϕ is computed based on a x, coordinate of I axis and a y, coordinate of Q axis in a constellation of the received signal.

3. The pragmatic trellis code modulation TCM decoder as recited in claim 2, wherein the basis phase is.

$$\frac{5\pi}{8}.$$

4. The pragmatic trellis code modulation TCM decoder as recited in claim 2, wherein the basis phase is.

$$\frac{\pi}{2}.$$

5. A decoding method for a pragmatic trellis code modulation TCM decoder, comprising the steps of:
 a) receiving a modulated signal and computing coordination values of symbols of the modulated signal on an I-axis and Q-axis in a constellation;
 b) generating 3-bit soft decision data based on computed coordinate values x' and y' by using equation x'=cos [2(ϕ−Φ)], y'=sin [2(ϕ−Φ)] based on a phase difference between a basis phase, Φ, and ϕ, wherein ϕ is computed based on a x, coordinate of I axis and a y, coordinate of Q axis in a constellation of the received signal;
 c) receiving the 3-bit soft decision data and generating 1-bit data as a coded data by decoding the 3-bit soft decision data;
 d) receiving the 1-bit data and obtaining un-coded information in order to compute an un-coded data;
 e) obtaining I channel and Q channel information based on the coordination values from the demodulator in order to obtain un-coded data;
 f) delaying an output of a sector phase quantizer until step d) outputs the un-coded information; and
 g) computing the un-coded data by decoding the output of the sector phase quantizer based on the un-coded information from a re-encoder and the I channel and Q channel information from the sector phase quantizer.

6. The method as recited in claim 5, wherein the basis phase is $$\frac{5\pi}{8}.$$

7. The method as recited in claim 5, wherein the basis phase is $$\frac{\pi}{2}.$$

8. A computer readable medium storing a program for executing a method for a pragmatic trellis code modulation TCM decoder, the method comprising the steps of:
 a) receiving a modulated signal and computing coordination values of symbols of the modulated signal on an I-axis and Q-axis in a constellation;
 b) generating 3-bit soft decision data based on computed coordinate values x' and y' by using equation x'=cos [2(ϕ−Φ)], y'=sin [2(ϕ−Φ)] based on a phase difference between a basis phase, Φ, and ϕ, wherein ϕ is computed based on a x, coordinate of I axis and a y, coordinate of Q axis in a constellation of the received signal;
 c) receiving the 3-bit soft decision data and generating 1-bit data as a coded data by decoding the 3-bit soft decision data;
 d) receiving the 1-bit data and obtaining un-coded information in order to compute an un-coded data;
 e) obtaining I channel and Q channel information based on the coordination values from the demodulator in order to obtain un-coded data;
 f) delaying an output of a sector phase quantizer until step d) outputs the un-coded information; and
 g) computing the un-coded data by decoding the output of the sector phase quantizer based on the un-coded information from a re-encoder and the I channel and Q channel information from the sector phase quantizer.

* * * * *